(12) United States Patent
Tsuboi et al.

(10) Patent No.: US 7,183,128 B2
(45) Date of Patent: Feb. 27, 2007

(54) PHOTO MASK AND SEMICONDUCTOR DEVICE MANUFACTURING METHOD

(75) Inventors: Shinji Tsuboi, Kanagawa (JP); Shinji Ishida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 618 days.

(21) Appl. No.: 10/323,969

(22) Filed: Dec. 20, 2002

(65) Prior Publication Data

US 2003/0124759 A1    Jul. 3, 2003

(30) Foreign Application Priority Data

Dec. 21, 2001    (JP) .............................. 2001-390458

(51) Int. Cl.
*H01L 21/00* (2006.01)
(52) U.S. Cl. ...................................... 438/48
(58) Field of Classification Search ................. 716/20, 716/21
See application file for complete search history.

(56) References Cited

U.S. PATENT DOCUMENTS 6,338,922 B1 *   1/2002   Liebmann et al. ............. 430/5
6,433,878 B1 *   8/2002   Niu et al. .................... 356/603

FOREIGN PATENT DOCUMENTS

| JP | 9-73166 | 3/1997 |
| JP | 10-10700 | 1/1998 |
| JP | 11-283904 | 10/1999 |

OTHER PUBLICATIONS

Akiyoshi Suzuki et al., "Multilevel imaging system realizing k1=0.3 lithography", Proceedings of SPIE Optical Microlithography SPIE, 3679, pp. 396-407, Mar. 1999.

* cited by examiner

*Primary Examiner*—Nathan W. Ha
(74) *Attorney, Agent, or Firm*—McGinn IP Law Group, PLLC

(57) ABSTRACT

A photo mask which is used for exposure of an isolated pattern and a dense pattern for a semiconductor substrate. The photo mask includes a transparent substrate, a pair of first patterns, a first assistant pattern and a plurality of second patterns. The pair of first patterns is separated from each other by a first distance, wherein one of the first pattern is arranged at one side of the isolated pattern, and another of the first pattern is arranged at another side. The first assistant pattern is provided apart from the one of the first pattern by the first distance. In the plurality of second patterns, each of the linear patterns is sandwiched between two of the second patterns that are adjacent to each other. One of the linear patterns is separated from adjacent the other of the linear patterns by a predetermined distance. A phase of light transmitted through the one of the first pattern and a phase of light transmitted through the assistant pattern are opposite to each other. A phase of light transmitted through one of the second patterns and a phase of light transmitted through another of the second patterns adjacent to the one of the second pattern are opposite to each other.

13 Claims, 10 Drawing Sheets

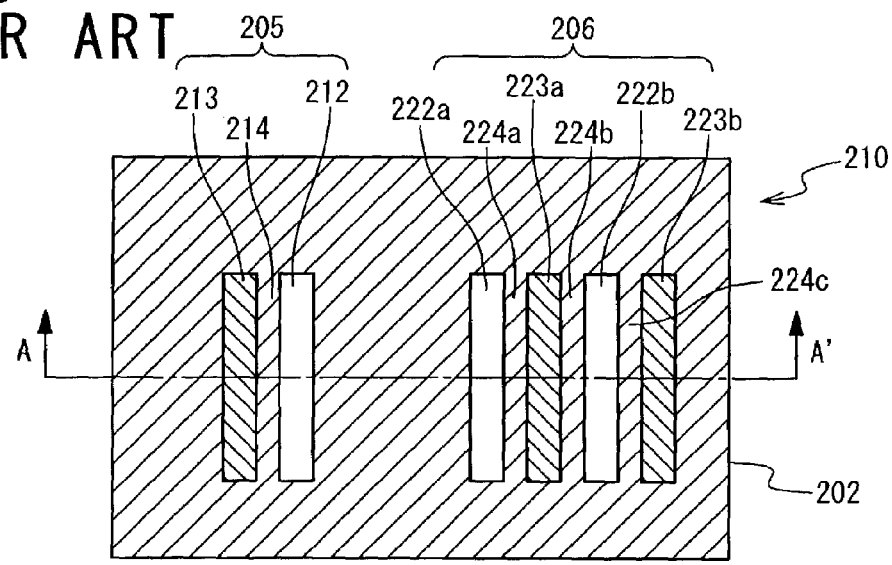
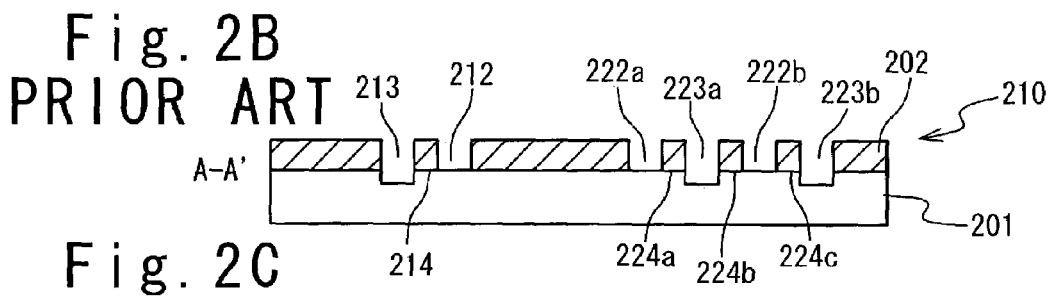
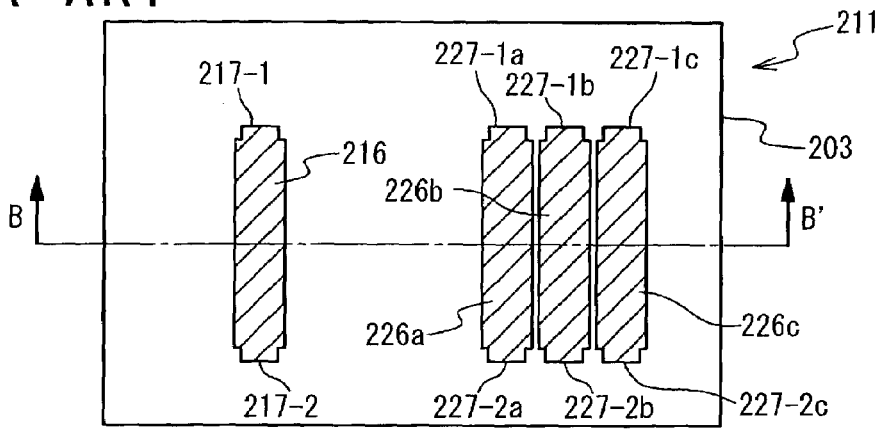
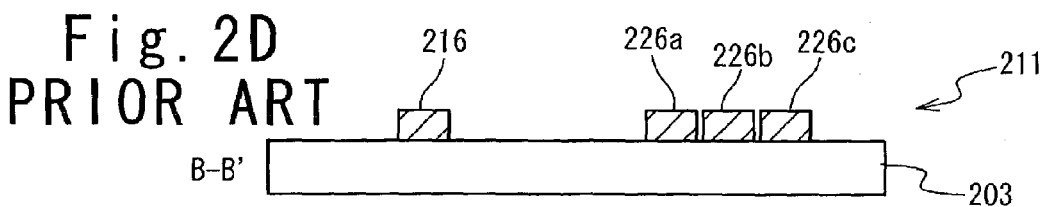

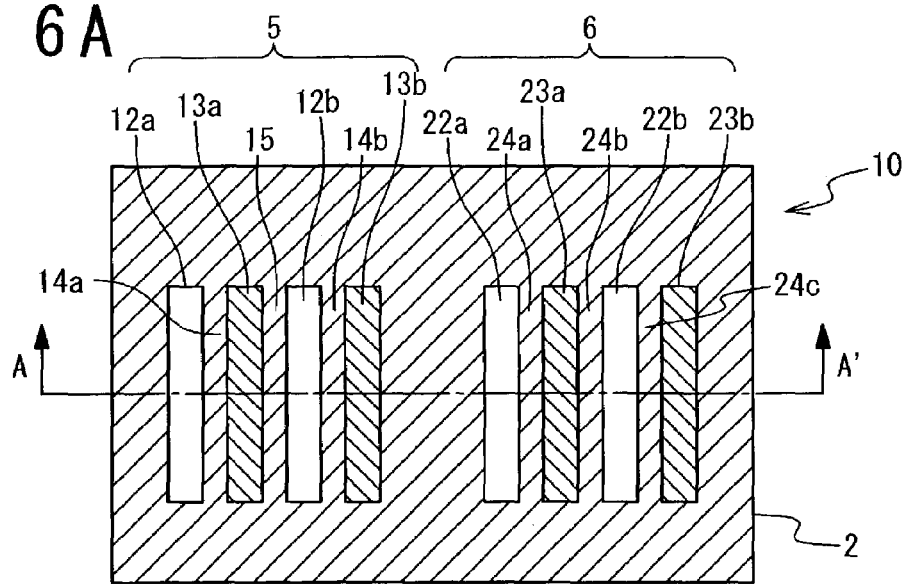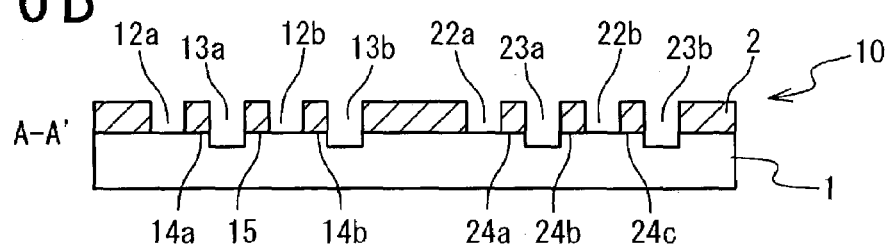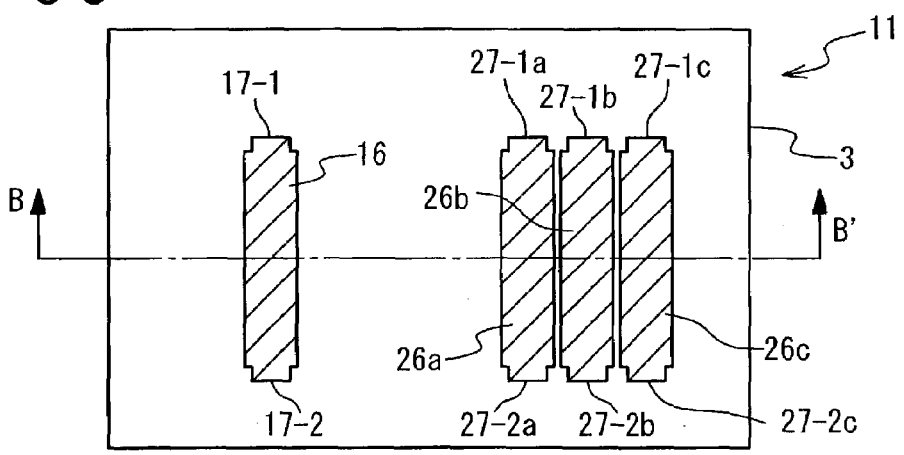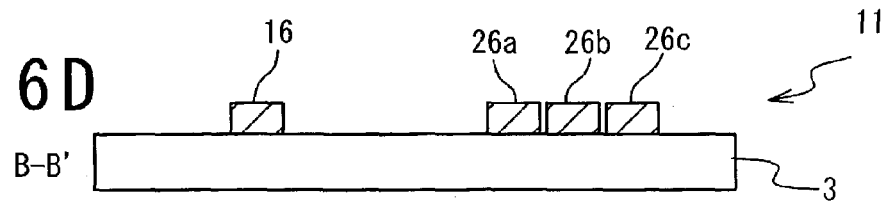

PHOTO MASK AND SEMICONDUCTOR DEVICE MANUFACTURING METHOD

BACKGROUND OF THE INVENTION

1. Field of the Invention

The present invention relates to a photo mask and a semiconductor device manufacturing method. More particularly, the present invention relates to a phase shifting type of a photo mask, an exposing apparatus, and a semiconductor device manufacturing method, which includes a method of forming a circuit pattern by using the photo mask.

2. Description of the Related Art

In association with a higher integrating degree of a semiconductor integrated circuit, the hyperfine structure of a circuit pattern formed on a semiconductor substrate has been advanced. The hyperfine structure of the circuit pattern causes a line width of a wiring, an electrode or the like to be extremely reduced. Correspondingly to the reduction, a request for a lithography technique has been very strong.

A phase shifting type of a photo mask (a phase shifting mask) is well known as one of the lithography techniques corresponding to the hyperfine structure of the circuit pattern. As the phase shifting mask, there are a Levenson's type in which the phases of lights transmitted through mask openings adjacent to each other on both sides of linear patterns are made opposite to each other, and a half tone type in which a transmission property is given to a light shielding portion, and a phase of a light transmitted through a mask opening is made opposite to a phase of the transmission light through the light shielding portion.

The Levenson's type phase shifting mask will be described below with reference to drawings.

FIGS. 1A to 1D are conceptual views showing the difference between the Levenson's type phase shifting mask and a usual photo mask.

FIG. 1A is a section view of the Levenson's type phase shifting mask (shown on a left side, hereafter similarly in FIGS. 1A to 1D), and the usual photo mask (shown on a right side, hereafter similarly in FIGS. 1A to 1D), and the manner of lights transmitted through each photo mask. FIG. 1B shows an amplitude distribution of the lights immediately after the transmission through each photo mask. FIG. 1C shows an amplitude distribution on a wafer of the lights transmitted through each photo mask. And, FIG. 1D shows an optical magnitude distribution on the wafer of the lights transmitted through each photo mask.

With reference to FIG. 1A, the Levenson's type phase shifting mask 101 has two openings of light shield films 103 formed on a glass substrate 102, and a material referred to as a shifter 104 is placed on one of the openings (besides, it may be shaped so as to be dug into the glass substrate 102 of the opening, instead of the shifter 104). In this case, a light 105 transmitted through the opening without the shifter 104 and a light 106 transmitted through the opening with the shifter 104 are out of phase by 180 degrees from each other (in this specification, referred to as an [Opposite Phase] state).

As shown in FIGS. 1A to 1D, in the Levenson's type phase shifting mask, the lights transmitted through the two openings have the phases ((a), (b)) opposite to each other. For this reason, when they arrive at the wafer and the lights are spread out, even if their feet overlap with each other (c), there is always a region of a magnitude of zero between them. Thus, there is no case that they strengthen each other (d). Hence, it is possible to resolve a linear pattern sandwiched between the two openings precisely and accurately. In addition, a focal depth can be improved.

On the other hand, in a usual photo mask 111, nothing is placed on two openings of light shield films 113 formed on a glass substrate 112 (and nothing is dug). In this case, the lights transmitted through the respective openings are at a state at which their phases are equal to each other (an in-phase state).

As shown in FIGS. 1A to 1D, in the usual photo mask, the lights transmitted-through the two openings have the phases ((a), (b)) equal to each other. Then, when they arrive at the wafer, the lights are spread out. Their feet overlap with each other (c), and they strengthen each other (d). Thus, it is difficult to resolve a linear pattern (a wiring pattern and the like) sandwiched between the two openings precisely and accurately.

On the other hand, in a photo lithography, it is known that the roughness and the fineness of a pattern cause a dimension of a latent image (hereafter, referred to as [Transfer Pattern]) formed on a semiconductor substrate to be different even under the same mask pattern dimension (a proximity effect). In particular, the optical magnitude distributions between lines and spaces pattern and an isolated pattern are different in a case of the same exposure amount. Here, the lines and spaces pattern is a pattern in which linear patterns are arranged cyclically and densely (hereafter, referred to as [Dense Pattern]). Also, the isolated pattern is a pattern in which a distance from a different pattern adjacent thereto is separated to a degree that a mutual influence can be ignored from the viewpoint of a lithography, and it is separated from the adjacent pattern by at least two times or more of a usual line width, and it is desired to be separated by three times or more.

For this reason, for example, when the exposure amount is adjusted such that the dense pattern is resolved in accordance with a design, this results in a problem that the isolated pattern is deviated from a designed dimension.

For this reason, when a photo mask to transfer the circuit pattern in which the isolated pattern and the dense pattern are mixed is used, the following method is employed. That is, this is the method of preliminarily providing a compensation (hereafter, referred to as [Mask Bias]) for the designed dimension of the isolated pattern of the photo mask and thereby avoiding the deviation in the designed dimension of the isolated pattern induced in the case when the dense pattern is exposed under the exposure condition in which it is resolved in accordance with the design.

That method will be described below in detail.

FIGS. 2A to 2D show a photo mask 210 (a plan view of FIG. 2A and an A–A' section view of FIG. 2B) used at a first step in an exposure to transfer a circuit pattern in which an isolated pattern and a dense pattern are mixed, and a photo mask 211 (a plan view of FIG. 2C and an A–A' section view of FIG. 2D) used at a second step.

Also, FIGS. 3A and 3B show a pattern (FIG. 3A) transferred by using the photo mask 210 and a pattern (FIG. 3B) transferred by using the photo mask 211 after that.

In FIG. 2A, the photo mask 210 is the Levenson's type phase shifting mask. It is formed by forming a light shield film 202 exemplified as Cr film on a glass substrate 201 exemplified as quartz glass and then patterning the light shield film 202 and the glass substrate 201. It has an isolated pattern region 205 to transfer an isolated pattern and a dense pattern region 206 to transfer a dense pattern.

The isolated pattern region 205 has an opening 212 and an opening 213. The opening 212 and the opening 213 are defined such that the phases of their transmission lights are opposite to each other (an opening 213 is dug, as shown in FIG. 2B). Then, an isolated pattern 214 between the opening 212 and the opening 213 is transferred.

On the other hand, the dense pattern region 206 has openings 222 (a, b) and openings 223 (a, b). The openings 222 (a, b) and the openings 223 (a, b) are defined such that the phases of their transmission lights are opposite to each other (the openings 223 (a, b) are dug, as shown in FIG. 2B). Then, dense patterns 224 (a, b, c) sandwiched between the openings 222 (a, b) and the openings 223 (a, b) are transferred.

Consequently, a transfer pattern A 208 as shown in FIG. 3A which has the size contracted from the photo mask 210 by a mask magnification is formed on a photo resist layer on a wafer (a semiconductor substrate). In FIG. 3A, the patterns corresponding to the opening 212 and the opening 213 are an open pattern 232 and an open pattern 233. Then, an isolated pattern 214 is transferred to a transfer isolated pattern 234. Also, the patterns corresponding to the openings 222 (a, b) and the openings 223 (a, b) are open patterns 242 (a, b) and open patterns 243 (a, b). Then, the dense patterns 224 (a, b, c) are transferred to transfer dense patterns 244 (a, b, c).

Next, in FIG. 2C, the photo mask 211 is the usual photo mask. It is formed by forming the light shield film exemplified as the Cr film on the glass substrate 203 exemplified as the quartz glass, and then patterning the light shield film. A light shield isolated pattern 216 optically shields a region generated by the open pattern 232, the transfer isolated pattern 234 and the open pattern 233. Light shield end patterns 217 (−1, 2) optically shield a region constituting ends (219 (−1, 2) of FIG. 3B) of a final circuit pattern (a transfer isolated pattern 220). Light shield dense patterns 226a, 226b and 226c optically shields a region generated by the open pattern 242a, the transfer dense pattern 244a and the open pattern 243a, a region generated by the open pattern 243a, the transfer dense pattern 244b and the open pattern 242b, and a region generated by the open pattern 242b, the transfer dense pattern 244c and the open pattern 243b, respectively. Light shield end patterns 227 (−1, 2) (a, b, c) optically shield a region constituting ends (229 (−1, 2) (a, b, c) of FIG. 3B) of a final circuit pattern.

Consequently, a transfer pattern B 209 as shown in FIG. 3B which has the size contracted from the photo mask 211 by a mask magnification is formed on a photo resist layer. In FIG. 3B, the pattern corresponding to the isolated pattern 214 of FIG. 2A is the transfer isolated pattern 220. The pattern corresponding to the light shield end pattern 217 of FIG. 2B is the transfer end pattern 219. Also, the patterns corresponding to the dense patterns 224 (a, b, c) of FIG. 2A are transfer dense patterns 230 (a, b, c). The patterns corresponding to the light shield end patterns 227 (a, b, c) of FIG. 2B are the transfer end patterns 229 (a, b, c).

In the above-mentioned processes, in the photo mask 210 to transfer the circuit pattern in which the isolated pattern and the dense pattern are mixed, the mask bias is preliminarily performed on the isolated pattern 214. That is, the dimension of the isolated pattern 214 on the photo mask is compensated in order to attain the dimension of the transfer isolated pattern 220 in accordance with the design.

This compensation will be described below with reference to FIG. 4.

FIG. 4 is an example of a graph showing a relation between a line width of a linear pattern and a distance between lines adjacent to each other (an inter-line distance), when the Levenson's type phase shifting mask is used. Its horizontal axis indicates a distance (hereafter, referred to as [Inter-Line Distance], nm) between linear patterns (hereafter, referred to as [Linear Transfer Pattern]) transferred to a photo resist layer, and its vertical axis indicates a line width (nm) of the linear transfer pattern. Here, a1, a2, a3, b1, A and B will be described with reference to FIG. 5.

Here, the line width of a targeted linear transfer pattern is designed as 100 nm, and the inter-line distance is designed as 250 nm. Then, let us consider the case when a light of an exposure amount and a photo mask from which the transfer pattern in accordance with the design can be obtained are used (indicated by 250 nm EOP in FIG. 4). On the photo mask, the pattern is usually formed at the size equal to several times the transfer pattern (hereafter, referred to as [Mask Magnification]). Then, if the distance between the patterns on the photo mask is changed in the above-mentioned photo mask, the inter-line distance of the transfer pattern is changed (the horizontal axis) In association with the change, the line width of the transferred pattern is changed (the vertical axis).

From this graph, in the above-mentioned condition, when the inter-line distance of the pattern on the photo mask is changed (however, the line width of the pattern on the photo mask is not changed) such that the interline distance on the transfer pattern becomes 150 nm, the line width on the transfer pattern becomes 75 nm. Thus, if a compensation of (+25(=100−75) nm×a mask magnification) is provided for the line width of the pattern on the photo mask (the increase in the line width of 25%), the line width after the transfer is expected to be 100 nm. Also, in a case when the inter-line distance is 300 nm, the line width on the transfer pattern is 115 nm. Hence, if a compensation of (−15(=100−115) nm×a mask magnification) is provided for the line width of the pattern on the photo mask (the decrease in the line width of 15%), the line width after the transfer is expected to be 100 nm.

The above-mentioned compensation is referred to as a mask bias. In the conventional process, the compensation for the isolated pattern is carried out in accordance with the above-mentioned theory.

However, in the actual compensation, the relation between the change amount of the line width on the photo mask and the change amount of the line width of the transfer pattern largely depends on the inter-line distance. It will be described below with reference to FIG. 5.

FIG. 5 is a graph showing the relation between a compensation amount of a line width of a photo mask and a compensation amount (a change amount) of a line width of a transfer pattern, in the condition of FIG. 4. Its horizontal axis is a photo mask compensation amount (nm)=a compensation amount of a line width of a pattern in a photo mask/a mask magnification. Its vertical axis is a line width compensation amount (nm)=a change amount (a compensation amount) of a line width changed (compensated) in a transfer pattern, when a pattern on a photo mask is compensated. In the graph, the curved lines a1, a2, a3 and b1 correspond to the points a1, a2, a3 and b1 in FIG. 4. The dashed line shows a case of a photo mask compensation amount=a line width compensation amount. This graph can be determined by an experiment or a simulation.

From FIG. 5, it is known that the slopes of the curved lines are gentle in the curved lines a1, a2 and a3. For example, in the curved line al (the inter-line distance is 400 nm in FIG. 4), even if the compensation corresponding to 200 nm with respect to the photo mask compensation amount is done, the line width compensation amount is 5 nm. With regard to this slope of the curved line, let us consider the following index MEF (Mask Error Factor).

$$MEF = \text{Line Width Compensation Amount/Photo Mask Compensation Amount} \quad (1)$$

This corresponds to the slope of each curved line of FIG. 5. That is, in the curved lines a1, a2 and a3, MEF is low. In the case of the curved line a1, MEF (a1)=0.25. Thus, if a compensation of 20 nm (=a line width compensation amount of 20 nm) is desired to be done in the transfer pattern, the photo mask compensation amount becomes 80 nm. This implies that the photo mask requires the compensation of 320 nm multiplied by the mask magnification (assumed to be 4).

On the other hand, in the case of the curved line b1 (the inter-line distance of 200 nm in FIG. 4), MEF (b1)=1.25. Thus, if the compensation of 20 nm (=the line width compensation amount of 20 nm) is desired to be done in the transfer pattern, it is enough to carry out the compensation corresponding to 16 nm, on the photo mask. Then, in the photo mask, it is enough to carry out the compensation of 64 nm multiplied by the mask magnification (assumed to be 4).

As mentioned above, in the Levenson's type phase mask, the compensation amount is largely different depending on the inter-line distance in the transfer pattern. Because of the restriction on the design of the photo mask, the restriction on the exposing apparatus and the like, there is the compensable range (the upper limit on the photo mask compensation amount). The illustrated range is the regions represented by A, B of FIG. 4. In the region represented by B, the inter-line distance is short, and it provides the effect of the phase mask. Thus, since the compensation amount is also low, the compensation is possible. However, in the region represented by A, the inter-line distance is long. Thus, the effect of the phase mask is poor, and the compensation amount becomes high. Hence, because of the above-mentioned restrictions, the compensation is impossible.

This implies that since the transfer pattern having the long inter-line distance (in this example, the inter-line distance of 300 nm or more) belongs to the A region, the hyperfine pattern of 100 nm or less can not be formed even if the effect of the Levenson's type phase mask is used. That is, the hyperfine pattern can not be formed in the isolated pattern (=the transfer pattern having the long inter-line distance).

As the related technique, Japanese Laid Open Patent Application (JP-A-Heisei 11-283904) discloses a technique of an exposing method. This technique is the exposing method of forming a latent image of a photo resist by carrying out a plurality of exposures including a high resolution exposure and a usual exposure. In the high resolution exposure, a pattern of a portion having a severe line width control property is transferred to a photo resist layer by using a phase shifting pattern. In the usual exposure, while the portion of the photo resist layer to which a pattern was already transferred through the high resolution exposure is protected by using a light shield portion of a mask pattern, a pattern of a portion having a relatively loose line width control property is transferred to the photo resist layer without any usage of the phase shifting pattern. This exposing method is used to form the latent pattern of the photo resist. However, the high resolution exposure employs the exposure condition that the transfer pattern line width after the high resolution exposure is performed on the portion having the severe line width control property is thicker than a desired line width. Then, the desired line width is obtained in the portion having the severe line width control property after the usual exposure.

That is, this is a two-stage (multiple) exposing method, as described below. For the pattern in which the line width control is difficult in the Levenson's type phase shifting mask such as the isolated pattern, a slightly thick transfer pattern is formed in the high resolution exposure using a first Levenson's type phase shifting mask. Then, the desirably slightly slender transfer pattern is formed in the usual exposure using a second usual photo mask.

In this case, since the final exposure is the usual exposure, it is influenced by the focal depth and the resolution of the usual exposure. Thus, in the exposure for transferring the circuit pattern in which the isolated pattern and the dense pattern are mixed, the formation of the hyperfine isolated pattern is considered to be difficult.

Also, Suzuki et al. announces the following technique for the pattern in which the line width control is difficult in the Levenson's type phase shifting mask such as the isolated pattern. At first, the Levenson's type phase shifting mask in which an isolated pattern and a cyclic pattern around it are formed is used to carry out a first exposure in a weak light. After that, the usual photo mask in which only the isolated pattern is formed is used to carry out a second exposure in a weak light. At this time, only the photo resist layer of the portion of the isolated pattern receives the lights corresponding to the two exposures. The magnitude of the weak light does not have the magnitude required to resolve under the light corresponding to only one exposure. However, it is set so as to have the magnitude required to resolve under the lights corresponding to the two exposures. Thus, only the photo resist layer of the portion of the isolated pattern receiving the lights corresponding to the two exposures is resolved. At this time, as for the material for the photo resist layer, the material suitable for it is also selected. (A. Suzuki et al., "Multilevel imaging system realizing k1=0.3 lithography", Proceedings of SPIE Optical Microlithography SPIE, 3679, (1999) pp. 396–407).

That is, the magnitudes of the lights for the exposures to be done two times and the sensibility of the photo resist layer are set so as to comply with the above-mentioned conditions. Thus, the exposures of the two times are done to thereby resolve the photo resist layer into the desirable pattern.

In this case, the stability of the magnitude of the exposing light, the characteristic regularity of the photo resist layer, the uniformity of a film thickness, the property of the photo resist material and the like influence each other. Thus, the technical difficulty is expected in view of the optimality of the condition and the reservation of the reliability.

Japanese Laid Open Patent Application (JP-A-Heisei 10-10700) discloses a technique of a photo mask and its manufacturing method.

The photo mask of this technique is a half tone phase shift type photo mask for transferring fine patterns which comprises a isolated pattern portion and a periodical pattern portion, and transfers fine patterns by using an interference of refracting lights at the periodical pattern portion. The isolated pattern portion includes a first opening fabricated in a semitransparent film covering with a transparent substrate. The periodical pattern portion includes a plurality of second openings periodically fabricated in the area separated from the area having the isolated portion by a certain distance in the semitransparent film. The thickness of the semitransparent film is $\lambda(n-1)/2$. Here, $\lambda$ is a wave length of a exposing light for transferring patterns, and n is refraction rate. The photo mask included a assistant pattern having a light shielding film with an width of W and separated from the first opening by the distance of L, and $0.2\lambda/NA < L$, $W<1$, $3\lambda/NA$. Here, NA is a number of openings of an exposing apparatus Japanese Laid Open Patent Application (JP-A-Heisei 9-73166) discloses a technique of a photo mask for an exposure and its manufacturing method.

The photo mask of this technique is a photo mask for an exposure that includes a pattern made by a light shielded film on the transparent substrate, and has a main pattern and an assistant pattern. The main pattern, which is transferred by using a projection exposure method on a surface of a semiconductor substrate, is made by the light shielded film. The assistant pattern, which is made by a film having a low refraction rate against a projection light for an exposure, is arranged around the main pattern.

SUMMARY OF THE INVENTION

Therefore, an object of the present invention is to provide a photo mask to form a hyperfine isolated pattern, in an exposure for transferring a circuit pattern in which an isolated pattern and a dense pattern are mixed, and a semiconductor device manufacturing method thereof.

Another object of the present invention is to provide a photo mask in which the formation of the hyperfine isolated pattern can be executed by an exposure of a deep focal depth without any proximity effect, and a semiconductor device manufacturing method thereof.

Still another object of the present invention is to provide a photomask in which the formation of the hyperfine isolated pattern can be easily executed without any substantial change in an exposing step and without any increase in the number of the photo masks, and a semiconductor device manufacturing method thereof.

Yet still another object of the present invention is to provide a photo mask in which the hyperfine isolated pattern can be formed without decreasing a throughput, increasing a cost, and a semiconductor device manufacturing method thereof.

In order to achieve an aspect of the present invention, the present invention provides a photo mask that is used for exposure of an isolated pattern and a dense pattern for a semiconductor substrate, in which the dense pattern has a plurality of linear patterns. The photo mask includes a transparent substrate, a pair of first patterns, a first assistant pattern and a plurality of second patterns. The pair of first patterns is separated from each other by a first distance, wherein one of the pair of first patterns is arranged at one side of the isolated pattern, and another of the pair of first patterns is arranged at another side of the isolated pattern. The first assistant pattern provided apart from the one first pattern by the first distance. The plurality of second patterns, wherein each of the plurality of linear patterns is sandwiched between two of the plurality of second patterns which are adjacent to each other. In the photo mask, one of the plurality of linear patterns is separated from adjacent the other of the plurality of linear patterns by a predetermined distance. A phase of light transmitted through the one first pattern and a phase of light transmitted through the assistant pattern are opposite to each other. Also, a phase of light transmitted through one of the plurality of second patterns and a phase of light transmitted through another of the plurality of second patterns adjacent to the one second pattern are opposite to each other.

The photo mask further includes a second assistant pattern. The second assistant pattern is provided apart from the another first pattern by the first distance. In the photo mask, a phase of light transmitted through the another first pattern and a phase of light transmitted through the second assistant pattern are opposite to each other.

In the photo mask, one of two patterns is covered with a shifter that shifts a phase of light transmitted through the one pattern to an opposite phase comparing with a phase of light transmitted through another of the two patterns. The two patterns are adjacent to each other, and selected from among the one first pattern, the another first pattern and the first assistant pattern.

In the photo mask, one of two patterns is dug in order to shifts a phase of light transmitted through the one pattern to an opposite phase comparing with a phase of light transmitted through another of the two patterns. The two patterns are adjacent to each other, and selected from among the one first pattern, the another first pattern and the first assistant pattern.

The photo mask further includes at least one third assistant pattern and at least one fourth assistant pattern. The third assistant pattern provided apart from the first assistant pattern by the first distance. The fourth assistant pattern provided apart from the second assistant pattern by the first distance. In the photo mask, a phase of light transmitted through the first assistant pattern and a phase of light transmitted through the third assistant pattern are opposite to each other. Also, a phase of light transmitted through the second assistant pattern and a phase of light transmitted through the fourth assistant pattern are opposite to each other.

In the photo mask, the predetermined distance is equal to the first distance.

In the photo mask, the first assistant pattern is the same shape as each one of the pair of first patterns.

In the photo mask, each one of pair of first patterns is the same shape as each one of the plurality of second patterns.

In the photo mask, the isolated pattern and the dense pattern are used for forming at least one of gate patterns or wiring patterns.

In the photo mask, a distance between the isolated pattern and a pattern which is the nearest one of the plurality of second patterns to the isolated pattern is at least two times larger than a width of the isolated pattern.

In order to achieve another aspect of the present invention, the present invention provides a photo mask set that is used for exposure of an isolated pattern and a dense pattern for a semiconductor substrate, in which the dense pattern has a plurality of linear patterns. The photo mask set includes a first photo mask and a second photo mask. The first photo mask includes a transparent substrate, a pair of first patterns, a first assistant pattern and a plurality of second patterns. The pair of first patterns is separated from each other by a first distance, wherein one of the pair of first patterns is arranged at one side of the isolated pattern, and another of the pair of first patterns is arranged at another side of the isolated pattern. The first assistant pattern provided apart from the one first pattern by the first distance. In the plurality of second patterns, each of the plurality of linear patterns is sandwiched between two of the plurality of second patterns which are adjacent each other. In the first photo mask, one of the plurality of linear patterns is separated from adjacent the other of the plurality of linear patterns by a predetermined distance. A phase of light transmitted through the one first pattern and a phase of light transmitted through the assistant pattern are opposite to each other. Also, a phase of light transmitted through one of the plurality of second patterns and a phase of light transmitted through another of the plurality of second patterns adjacent to the one second pattern are opposite to each other. The second photo mask includes a transparent substrate, a third pattern and a plurality of fourth pattern. The third pattern covers the isolated pattern. The plurality of fourth patterns covers the dense pattern.

In the photo mask set, the first photo mask further includes a second assistant pattern. The second assistant pattern provided apart from the another first pattern by the first distance. A phase of light transmitted through the another first pattern and a phase of light transmitted through the second assistant pattern are opposite to each other.

In order to achieve still another aspect of the present invention, the present invention provides a method of manufacturing a semiconductor apparatus. The method of manufacturing a semiconductor apparatus includes the steps of (a) to (e). That is, (a) coating photo resist on a semiconductor substrate; (b) carrying out a first exposure by using a first photo mask; (c) carrying out a second exposure by using a second photo mask; (d) removing a part of the photo resist which is exposed by the first exposure and the second exposure; and (e) etching the semiconductor substrate based on a pattern of the photo resist. In the method of manufacturing a semiconductor apparatus, the first photo mask is used for exposure of an isolated pattern and a dense pattern for the semiconductor substrate, in which the dense pattern has a plurality of linear patterns. The first photo mask includes a transparent substrate, a pair of first patterns, a first assistant pattern and a plurality of second patterns. The pair of first patterns is separated from each other by a first distance, wherein one of the pair of first patterns is arranged at one side of the isolated pattern, and another of the pair of first patterns is arranged at another side of the isolated pattern. The first assistant pattern provided apart from the one first pattern by the first distance. The plurality of second patterns wherein each of the plurality of linear patterns is sandwiched between two of the plurality of second patterns that are adjacent each other. In the first photo mask, one of the plurality of linear patterns is separated from adjacent the other of the plurality of linear patterns by a predetermined distance. A phase of light transmitted through the one first pattern and a phase of light transmitted through the assistant pattern are opposite to each other. Also, a phase of light transmitted through one of the plurality of second patterns and a phase of light transmitted through another of the plurality of second patterns adjacent to the one second pattern are opposite to each other. The second photo mask includes a transparent substrate, a third pattern and a plurality of fourth patterns. The third pattern covers the isolated pattern. The plurality of fourth patterns covers the dense pattern.

In the method of manufacturing a semiconductor apparatus, the first photo mask further includes a second assistant pattern provided apart from the another first pattern by the first distance. In the first mask, a phase of light transmitted through the another first pattern and a phase of light transmitted through the second assistant pattern are opposite to each other.

In the method of manufacturing a semiconductor apparatus, one of two patterns is covered with a shifter that shifts a phase of light transmitted through the one pattern to an opposite phase comparing with a phase of light transmitted through another of the two patterns. The two patterns are adjacent to each other, and selected from among the one first pattern, the another first pattern and the first assistant pattern.

In the method of manufacturing a semiconductor apparatus, one of two patterns is dug in order to shifts a phase of light transmitted through the one pattern to an opposite phase comparing with a phase of light transmitted through another of the two patterns. The two patterns are adjacent to each other, and selected from among the one first pattern, the another first pattern and the first assistant pattern.

In the method of manufacturing a semiconductor apparatus, the first photo mask further includes at least one third assistant pattern and at least one fourth assistant pattern. The third assistant pattern provided apart from the first assistant pattern by the first distance. The fourth assistant pattern provided apart from the second assistant pattern by the first distance. A phase of light transmitted through the first assistant pattern and a phase of light transmitted through the third assistant pattern are opposite to each other. Also, a phase of light transmitted through the second assistant pattern and a phase of light transmitted through the fourth assistant pattern are opposite to each other.

In the method of manufacturing a semiconductor apparatus, the predetermined distance is equal to the first distance.

In the method of manufacturing a semiconductor apparatus, the first assistant pattern is the same shape as each one of the pair of first patterns.

In the method of manufacturing a semiconductor apparatus, the each one of pair of first patterns is the same shape as each one of the plurality of second patterns.

BRIEF DESCRIPTION OF THE DRAWINGS

FIG. 2A is a plan view showing a configuration of a photo mask of a phase shifting type for a circuit pattern in which an isolated pattern and a dense pattern are mixed, in accordance with a conventional technique;

FIG. 2B is a section view showing a configuration of a photo mask of a phase shifting type for a circuit pattern in which an isolated pattern and a dense pattern are mixed, in accordance with a conventional technique;

FIG. 2C is a plan view showing a configuration of a usual photo mask for a circuit pattern in which an isolated pattern and a dense pattern are mixed, in accordance with a conventional technique;

FIG. 2D is a section view showing a configuration of a usual photo mask for a circuit pattern in which an isolated pattern and a dense pattern are mixed, in accordance with a conventional technique;

FIG. 6A is a plan view showing a configuration of a photo mask of a phase shifting type for a circuit pattern in which an isolated pattern and a dense pattern are mixed, according to the present invention;

FIG. 6B is a section view showing a configuration of a photo mask of a phase shifting type for a circuit pattern in which an isolated pattern and a dense pattern are mixed, according to the present invention;

FIG. 6C is a plan view showing a configuration of a photo mask of a usual type for a circuit pattern in which an isolated pattern and a dense pattern are mixed, according to the present invention;

FIG. 6D is a section view showing a configuration of a photo mask of a usual type for a circuit pattern in which an isolated pattern and a dense pattern are mixed, according to the present invention;

DESCRIPTION OF THE PREFERRED EMBODIMENTS

Figure 1A:
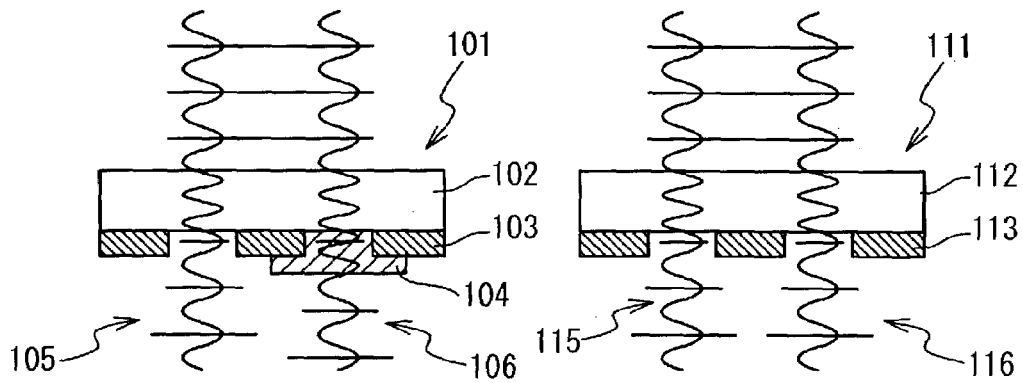
FIG. 1A is a conventional conceptual view showing a difference between a Levenson's type phase shifting mask and a usual photo mask.
Figure 1B:
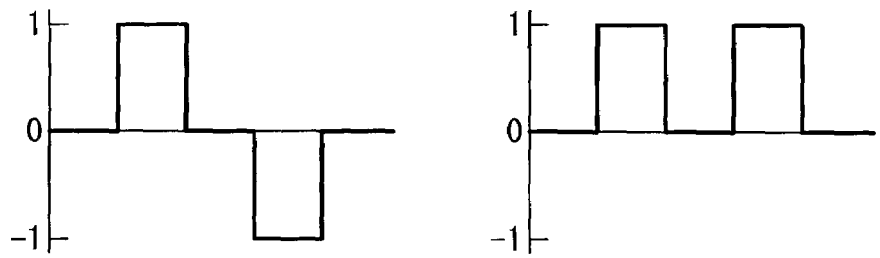
FIG. 1B is a conventional conceptual view showing a difference between a Levenson's type phase shifting mask and a usual photo mask.
Figure 1C:
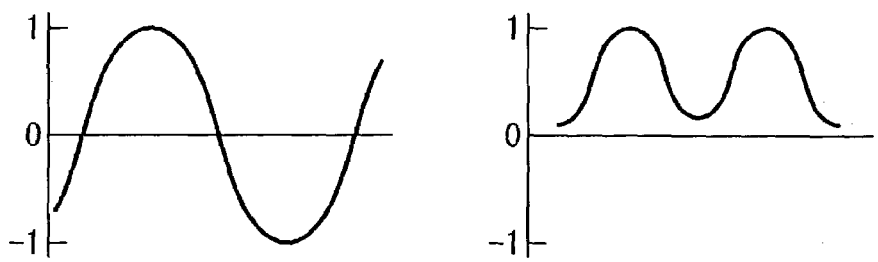
FIG. 1C is a conventional conceptual view showing a difference between a Levenson's type phase shifting mask and a usual photo mask.
Figure 1D:
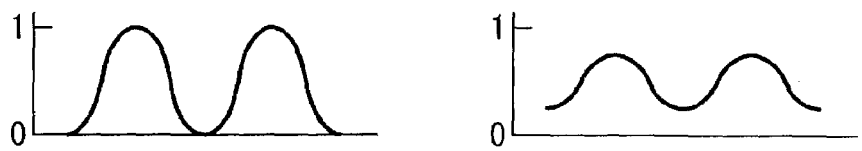
FIG. 1D is a conventional conceptual view showing a difference between a Levenson's type phase shifting mask and a usual photo mask.
Figure 3A:
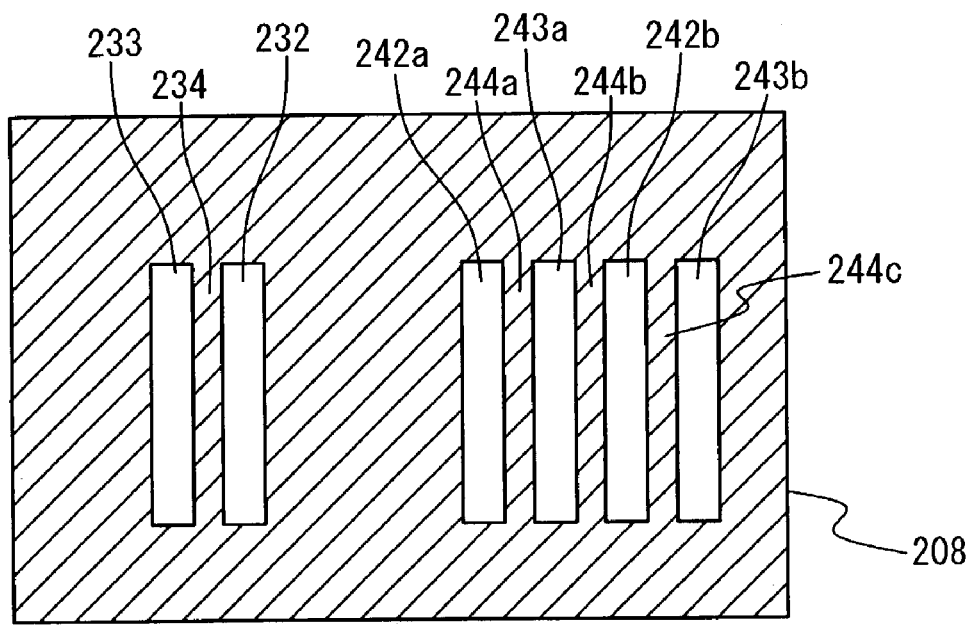
FIG. 3A is a view showing a pattern transferred in the photo mask of FIG. 2A.
Figure 3B:
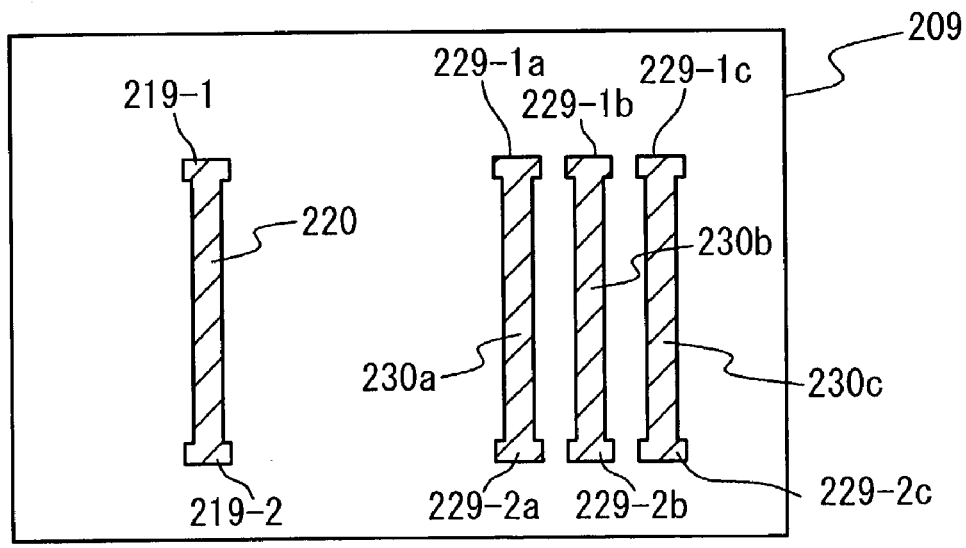
FIG. 3B is a view showing a pattern transferred in the photo mask of FIG. 2B after transferred in the photo mask of FIG. 2A.

Embodiment of a photo mask and a semiconductor device manufacturing method, according to the present invention, will be described below with reference to the attached drawings.

FIGS. 6A to 6D are the views showing a configuration in an embodiment of a photo mask, according to the present invention.

A photo mask 10 is a photo mask used at a first step of an exposure for transferring a circuit pattern in which an isolated pattern and a dense pattern are mixed. FIG. 6A is a plan view of the photo mask 10, and FIG. 6B is an A–A' section view of the photo mask 10.

The photo mask 10 serving as a first photo mask is formed by forming a light shield film 2 exemplified as Cr film on a glass substrate 1 exemplified as quartz glass, and then patterning the light shield film 2 and the glass substrate 1. The photo mask 10 is the Levenson's type phase shifting mask having an isolated pattern region 5 and a dense pattern region 6. The Levenson's type phase shifting mask is exemplified as a placing shifter type or a digging substrate type. This embodiment is the type dug into the substrate. It has openings 12 (a, b), openings 13 (a, b) and openings 22 (a, b), openings 23 (a, b). The exposing light can be transmitted through only the openings.

A pattern of a photo mask to form an isolated pattern is formed in the isolated pattern region 5. It includes the openings 12 (a, b) and the openings 13 (a, b) and assistant patterns 14 (a, b) and an isolated pattern 15.

Figure 4:
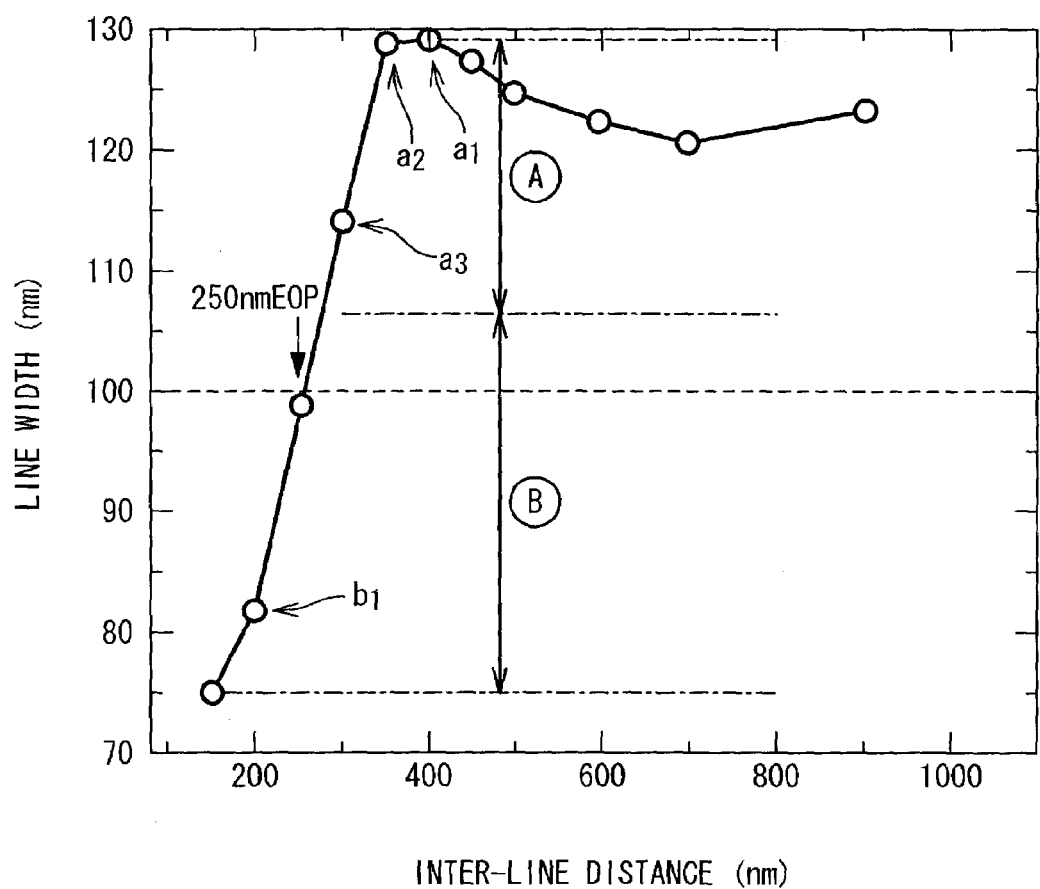
FIG. 4 is a graph showing a relation between a line width of a linear pattern and a distance between lines adjacent to each other, in an exposure using a phase shifting mask.
Figure 5:
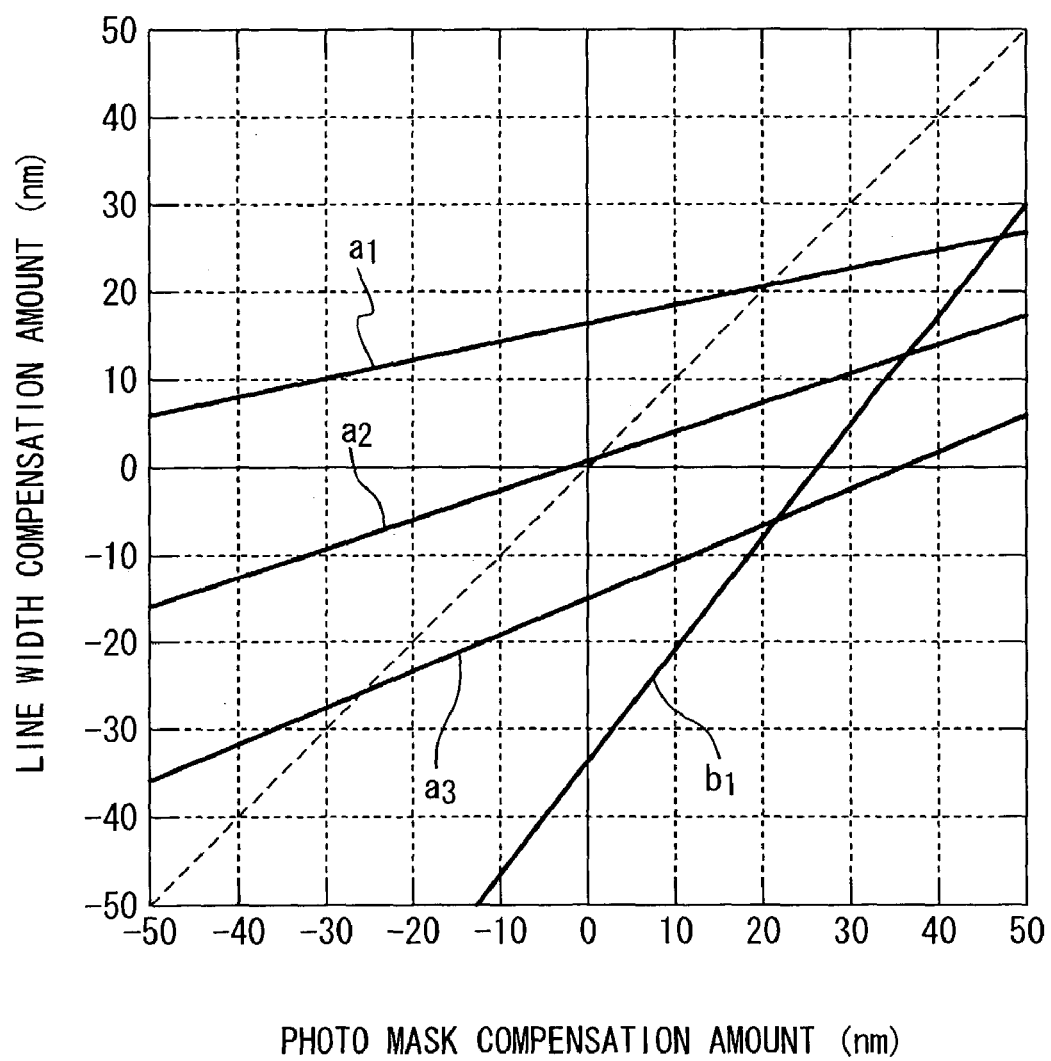
FIG. 5 is a graph showing a relation between a compensation amount of a line width on a photo mask and an actual compensation amount of a transferred line width.

The openings 12 (a, b) and the openings 13 (a, b) are slenderly rectangular in shape. They are arranged at an equal interval (a first interval), in parallel to each other, in the order of the opening 12a, the opening 13a, the opening 12b and the opening 13b. They are formed such that the phases of transmission lights through the openings adjacent to each other are opposite to each other. That is, the opening 12a and the opening 12b are at the in-phase state, and the opening 13a and the opening 13b are at the phase state opposite to them (13a and 13b shown in FIG. 6B, in which the openings 13 are dug). Then, the distance from each other is arranged such that the effect of the phase shifting can be used and the inter-line distance in which the compensation described in FIGS. 4 and 5 can be attained is formed in the transfer pattern.

The assistant pattern 14a, the isolated pattern 15 and the assistant pattern 14b are the light shield regions sandwiched between the opening 12a (the assistant open pattern) and the opening 13a (the first pattern), between the opening 13a and the opening 12b (the first pattern) and between the opening 12b and the opening 13b (the assistant open pattern), respectively. Among them, the transfer pattern formed in the region optically shielded by the central isolated pattern 15 (between the opening 13a and the opening 12b) is the finally targeted transfer isolated pattern 20 (which will be explained later).

Typically, the opening 12a and the opening 13b (and the assistant pattern 14a (between the opening 12a and the opening 13a) formed by them and the assistant pattern 14b (between the opening 12b and the opening 13b) are not required (absent in FIG. 6A). However, as for the isolated pattern 15, in order to make the best use of the feature of the Levenson's type phase shifting mask, remove the proximity effect, increase the focal depth, carry out the compensation described in FIGS. 4 and 9, and form the hyperfine isolated pattern, in the present invention, the opening 12a and the opening 13b are formed in the photo mask 10. Due to the opening 12a and the opening 13a, the opening 13a and the opening 12b, and the opening 12b and the opening 13b through which the exposing lights having the phases opposite to each other are transmitted, the hyperfine patterns equal to the dense patterns corresponding to the assistant pattern 14a, the isolated pattern 15 and the assistant pattern 14b can be formed on the photo resist layer.

As for the openings formed as the assistants such as the opening 12a and the opening 13b, even only one of them provides the effect (in this embodiment, any one of the opening 12a and the opening 13b). Preferably, such as the opening 12a and the opening 13b in this embodiment, they are desired to be symmetrically located on both sides of the opening 12b and the opening 13a (at the symmetrical positions with respect to the isolated pattern 15). Also, the number may be equal to or greater than the case of this embodiment.

In the dense pattern region 6, a pattern of a photo resist is formed to form a dense pattern. It has openings 22 (a, b) and openings 23 (a, b) and dense patterns 24 (a, b, c)

The openings 22 (a, b) and the openings 23 (a, b) are slenderly rectangular in shape. They are arranged at an equal interval (a second interval), in parallel to each other, in the order of the opening 22a, the opening 23a, the opening 22b and the opening 23b, and they are formed such that the phases of transmission lights through the openings adjacent to each other are opposite to each other. That is, the opening 22a and the opening 22b are at the in-phase state, and the opening 23a and the opening 23b are at the phase state opposite to them (23a and 23b shown in FIG. 6B in which the openings 23 are dug). Then, the distance from each other is arranged such that the effect of the phase shifting can be used and the inter-line distance in which the compensation described in FIGS. 4 and 5 can be attained is formed in the transfer pattern.

The dense patterns 24 (a, b, c) are the light shield regions sandwiched between the opening 22a (the second pattern)

and the opening 23a (the second pattern), between the opening 23a and the opening 22b (the second pattern) and between the opening 22b and the opening 23b (the second pattern), respectively. They constitute the finally targeted transfer dense patterns 30 (a, b, c) (which will be explained later).

Next, the photo mask 11 is the photo mask to be used at a second step of the exposure for transferring the circuit pattern in which the isolated pattern and the dense pattern are mixed. FIG. 6C shows a plan view of the photo mask 11, and FIG. 6D shows a BB'section view.

The photo mask 11 serving as a second photo mask is formed by forming a light shield film exemplified as Cr film on a glass substrate exemplified as quartz glass, and then patterning the entire pattern of the photo mask 11 on the light shield film. The photo mask 11 is the usual photo mask. A light shield isolated pattern 16 serving as a third pattern covers the region composed of the opening 13a, the isolated pattern 15 and the opening 12b of the photo mask 10, and optically shields them. Light shield end patterns 17 (−1, 2) covers the region constituting the ends (19 (−1, 2) of FIG. 7B, which will be described later) of the final circuit pattern, and optically shields them. Light shield dense patterns 26a, 26b and 26c serving as a fourth pattern covers the region composed of the opening 22a, the dense pattern 24a and the opening 23a of the photo mask 10, the region composed of the opening 23a, the dense pattern 24b and the opening 22b, and the region composed of the opening 22b, the dense pattern 24c and the opening 23b, respectively, and optically shields them. Light shield end patterns 27 (−1, 2) (a, b, c) cover the region constituting the ends (29 (−1, 2) (a, b, c) of FIG. 7B) of the final circuit pattern, and optically shields them.

If the first interval and the second interval are different from each other, the exposure is done by using the exposing condition matched with any one of the first pattern and the second pattern. Then, the compensation is done by performing the mask bias on the other pattern. However, if the first interval and the second interval are equal to each other, it is not necessary to carry out the mask bias. Thus, the mask design becomes easy.

Also, the photo mask 10 and the photo mask 11 are exemplified as the set of the photo masks (the photo mask set) to expose the circuit pattern in which the isolated pattern and the dense pattern are mixed. The photo mask of the present invention and the pattern shape thereof are not limited to this example.

The exposing apparatus for carrying out the exposure by using the photo mask 10 and the photo mask 11 will be described below.

FIG. 6O is a view showing a configuration of an exposing apparatus 60.

The exposing apparatus 60 includes an exposure controller 50 and an exposing unit 51. The exposing unit 51 has a light source 52, a fly eye lens 53, a throttle 54, a condenser lens 55, a reticle 56, a reduction projection lens 57 and an XY stage 59. A wafer 58 is set on the XY stage.

The exposure controller 50 controls the respective units (the light source 52, the throttle 54, the XY stage 59 and the like) in the exposing unit 51, and thereby changes the exposing condition matched with the photo mask, and then carries out the exposure. The exposing conditions corresponding to the respective photo masks (or the respective processes) are stored in a memory (not shown) installed therein.

The light source 52 emits the exposing light. It is exemplified as a high pressure mercury lamp, a KrF excimer laser and an ArF excimer laser.

The fly eye lens 53 is an optical element in which a plurality of rows of single lens of the same type are piled up, and it uniforms the illuminations of the lights from the light source 52 on the entire exposure plane.

The throttle 54 adjusts the magnitude of the exposing light emitted from the fly eye lens 53.

The condenser lens 55 suppresses the expansion of the exposing light, and makes the lights parallel to each other.

The reticle 56 is a photo mask 10 or a photo mask 11 in this embodiment.

The reduction projection lens 57 reductively projects the lights transmitted through the photo masks (10, 11) onto (a photo resist layer) on the wafer 58 to thereby generate an image. In this embodiment, it is reduced to 4:1.

The XY stage 59 can be moved in two directions vertical to each other. It carries out a step and repeats operation so that a proper position on the wafer 58 can be exposed at a time of the exposure.

At the time of the exposure, the exposing apparatus 60 carries out the following operations.
(1) The exposure controller 50 automatically sets the photo mask 10 (or the photo mask 11) at a position of the reticle 56.
(2) The exposure controller 50 automatically sets the wafer 58 at the proper position on the XY stage 59.
(3) The exposure controller 50 adjusts the respective units of the exposing unit 51, in accordance with a preset exposing condition.
(4) The exposure controller 50 opens a shutter (not shown) and carries out the exposure.

The embodiment of the semiconductor device manufacturing method to which the photo mask according to the present invention is applied will be described below with reference to the attached drawings.

This embodiment shows a manufacturing method of forming a circuit pattern in which an isolated pattern and a dense pattern are mixed, in the semiconductor device manufacturing method. Such a circuit pattern is exemplified as a wiring pattern and a gate pattern. The semiconductor device manufacturing method and the photo mask, according to the present invention, are not limited to them. They can be used even in a circuit pattern in which other isolated patterns and dense patterns are mixed.

The manufacturing method will be described below.
(1) Photo resist is coated on a wafer (a semiconductor substrate), and a photo resist layer is formed. The wafer (the semiconductor substrate) includes the semiconductor device in which a semiconductor element is formed on a surface thereof.
(2) The exposing apparatus 60 carries out the exposure by using the photo mask 10. Then, a first exposure substrate is obtained (the substrate after the exposure of the wafer having the (1) photo resist layer). This results in the generation of the wafer in which a transfer pattern A 8 shown in FIG. 7A is sensitized.

Figure 7A:
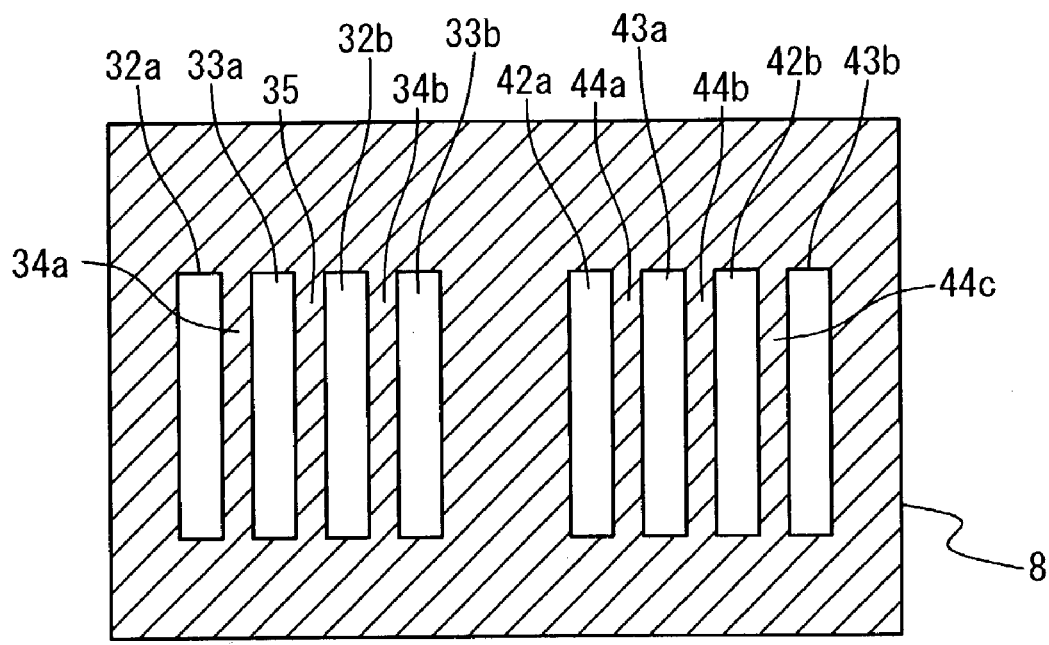
FIG. 7A is a view showing a pattern transferred in the photo mask of FIG. 6A.

Here, FIG. 7A is described.

FIG. 7A shows the pattern, which is transferred to the photo resist layer and sensitized by using the photo mask 10. In FIG. 7A, the openings corresponding to the openings 12 (a, b) and the openings 13 (a, b) are openings 32 (a, b) and openings 33 (a, b). Then, the assistant patterns 14 (a, b) are transferred to transfer assistant patterns 34 (a, b) serving as a third resist pattern, and the isolated pattern 15 is transferred to a transfer isolated pattern 35. Also, the openings corresponding to the openings 22 (*a*, *b*) and the openings 23 (*a*, *b*) are open patterns 42 (*a*, *b*) and open patterns 43 (*a*, *b*). Then, the dense patterns 24 (*a*, *b*, *c*) are transferred to transfer dense patterns 44 (*a*, *b*, *c*).

However, after the exposure, the sensitized photo resist portion is not developed and removed. Thus, the sensitized photo resist is left on the open patterns 32 (*a*, *b*), the open pattern 33 (*a*, *b*), the open patterns 42 (*a*, *b*) and the open patterns 43 (*a*, *b*).

(3) Next, the exposure is performed on the (2) first exposure substrate by the exposing apparatus 60 by using the photo mask 11. A second exposure substrate is obtained (the substrate after the exposure of the wafer with the photo resist layer at the state of FIG. 7A).

(4) The sensitized photo resist portion is developed and removed. Consequently, a transfer pattern B 9 shown in FIG. 7B is formed.

Figure 7B:
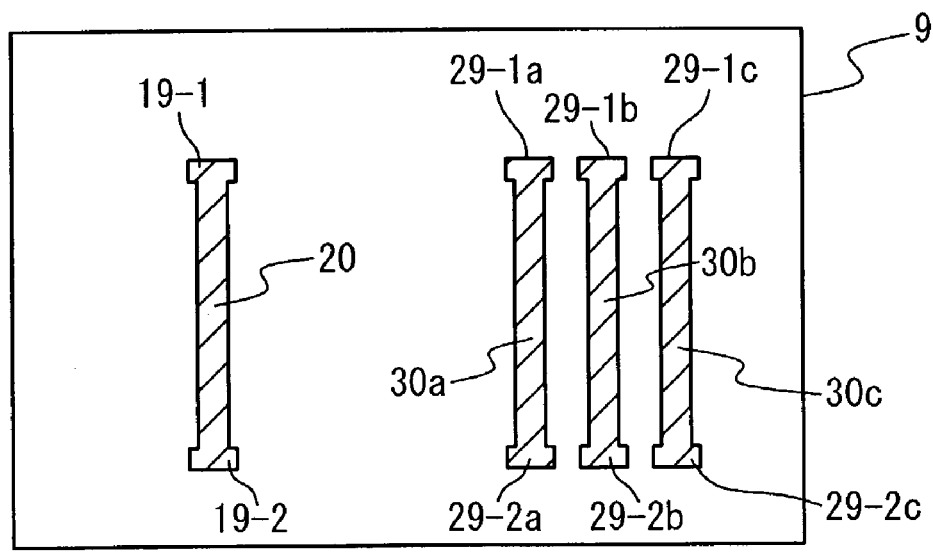
FIG. 7B is a view showing a pattern transferred in the photo mask of FIG. 6B after transferred in the photo mask of FIG. 6A.

Here, FIG. 7B is described.

FIG. 7B shows the pattern which is transferred to the photo resist layer and formed by using the photo mask 10 and the photo mask 11. In FIG. 7B, the pattern corresponding to the isolated pattern 15 of FIG. 6A is a transfer isolated pattern 20. The patterns corresponding to the light shield end patterns 17 (−1, 2) of FIG. 6B are transfer end patterns 19 (−1, 2). At this time, the transfer patterns (the transfer assistant patterns 34 (*a*, *b*)) corresponding to the assistant patterns 14 (*a*, *b*) of FIG. 6A are developed and removed, and they are not left, since the light shield film of the photo mask 11 is not protected at the (3) process.

Also, the patterns corresponding to the dense patterns 24 (*a*, *b*, *c*) of FIG. 6A are the transfer dense patterns 30 (*a*, *b*, *c*). The patterns corresponding to the light shield end patterns 27 (−1, 2) (*a*, *b*, *c*) of FIG. 6B are the transfer end patterns 29 (−1, 2) (*a*, *b*, *c*).

Here, the relation between the photo masks 10, 11 and the pattern (FIG. 7B) which is transferred to the photo resist layer and formed by using them is further described with reference to FIG. 8.

Figure 8:
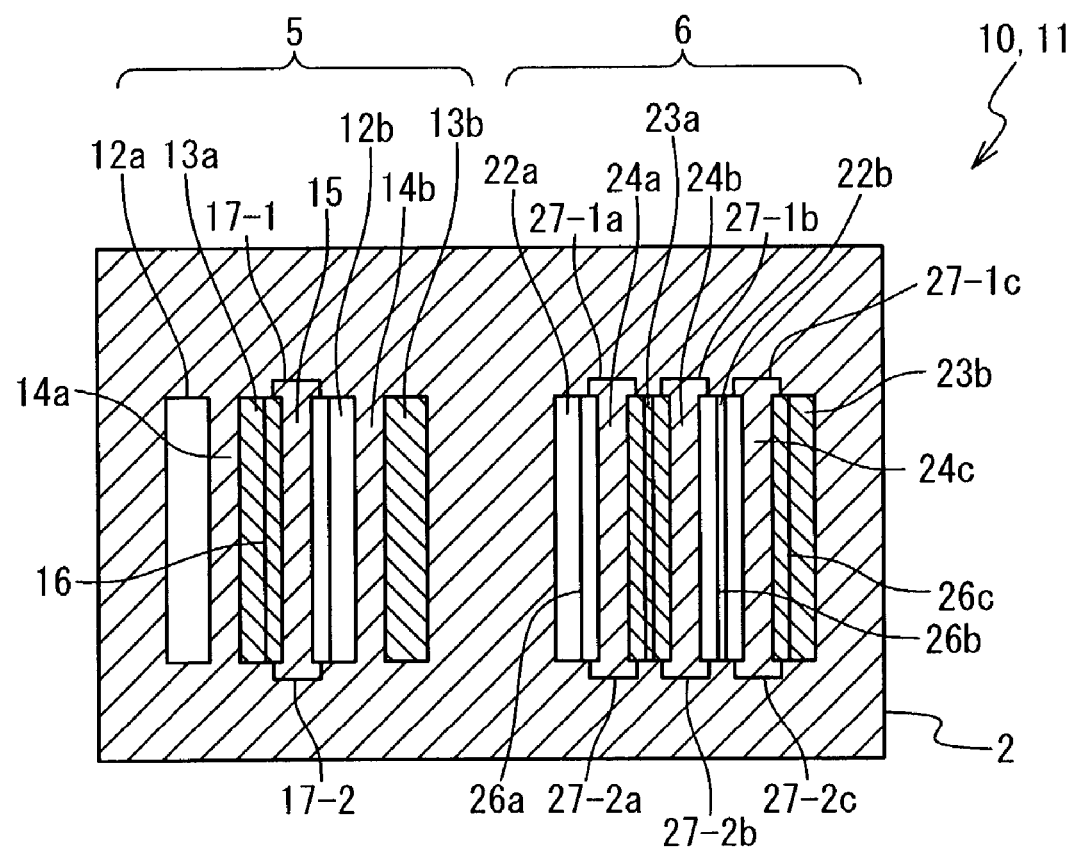
FIG. 8 is a view showing a situation in which a photo mask 10 and a photo mask 11 overlap with each other.

FIG. 8 is a view showing the situation in which the photo masks 10, 11 overlap with each other (the meanings of the respective members are as described in FIGS. 6A to 6D). As can be seen from FIG. 8, the transfer isolated pattern 20 and the transfer end patterns 19 (−1, 2) of FIG. 7B are formed correspondingly to the isolated pattern 15 of the photo mask 10 and the light shield end patterns 17 (−1, 2) of the photo mask 11. Also, the transfer dense patterns 30 (*a*, *b*, *c*) and the transfer end patterns 29 (−1, 2) (*a*, *b*, *c*) of FIG. 7B are formed correspondingly to the dense patterns 24 (*a*, *b*, *c*) of the photo mask 10 and the light shield end patterns 27 (−1, 2) (*a*, *b*, *c*) of the photo mask 11.

(5) In accordance with the circuit pattern formed on the photo resist layer, a (dry or wet) etching is carried out to thereby obtain the circuit pattern having the desired shape.

By using the above-mentioned semiconductor device manufacturing method, it is possible to form the circuit pattern in which the isolated pattern and the dense pattern are mixed.

Here, the positional relation (the distance and the angle) between the isolated pattern region 5 and the dense pattern region 6 is not limited to the relation such as this embodiment, unless they have the optical influence on each other).

The above-mentioned process can form the hyperfine pattern such as the dense pattern on the photo resist layer by forming the assistant patterns 14 (*a*, *b*) around the isolated pattern 15, in the photo mask 10 to transfer the circuit pattern in which the isolated pattern and the dense pattern are mixed, and then providing the cyclic property similar to that of the dense pattern. At this time, the effect of the Levenson's type phase shifting mask (the improvement of the focal depth, the hyperfine structure using the compensation of the mask bias and the like) can be applied even to the isolated pattern. Also, the transfer assistant patterns 34 (*a*, *b*) simultaneously formed on the photo resist layer through the assistant pattern 14 at that time, since removed by the second usual exposure, do not have any influence on the final transfer pattern.

That is, even if the circuit pattern in which the isolated pattern and the dense pattern are mixed is transferred, the first trial is exposed under the exposure condition of the dense pattern, and the second trial is exposed under the usual exposure condition. Thus, the past exposure condition can be applied in its original state to both of the first and second exposures. Thus, the time and the labor to find out the special exposure condition are not required. Hence, it is possible to easily attain the hyperfine structure of the isolated pattern.

Then, it is not necessary to carry out the works of the optimality of the condition and the reservation of the reliability and the like, such as the stability of the magnitude of the exposing light, the characteristic regularity of the photo resist layer, the uniformity of the film thickness, the property of the photo resist material and the like.

The conventional technique carries out the two exposures. Thus, in the process for carrying out the two exposures according to the present invention, the process time is never increased, and the number of the masks is never increased. Hence, this can be done without any difference from the conventional technique, with regard to the manufacturing cost and the throughput.

The result when the wiring pattern is formed by using the above-mentioned semiconductor device manufacturing method will be described below with reference to FIG. 9.

Figure 9:
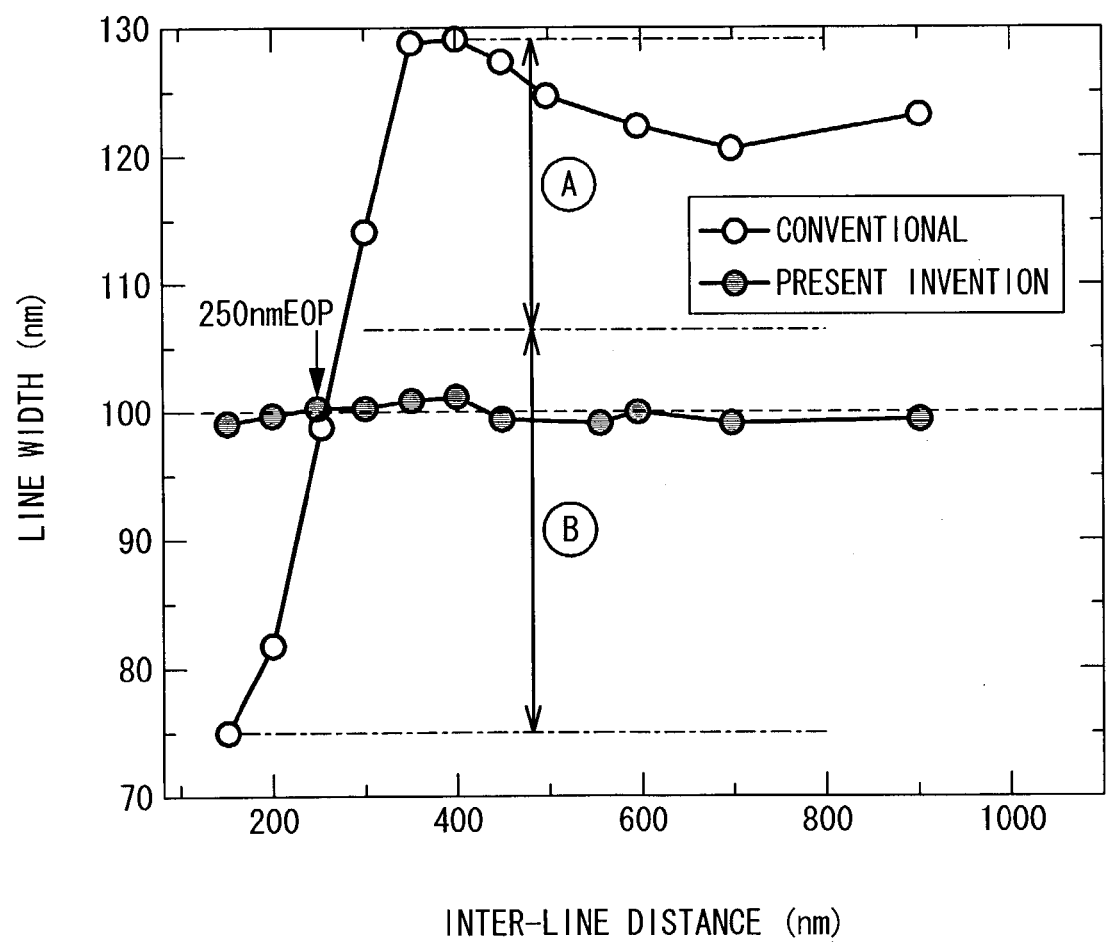
FIG. 9 is a graph showing an example of a result when a wiring pattern is formed by using a photo mask and a semiconductor device manufacturing method, according to the present invention.
Figure 10:
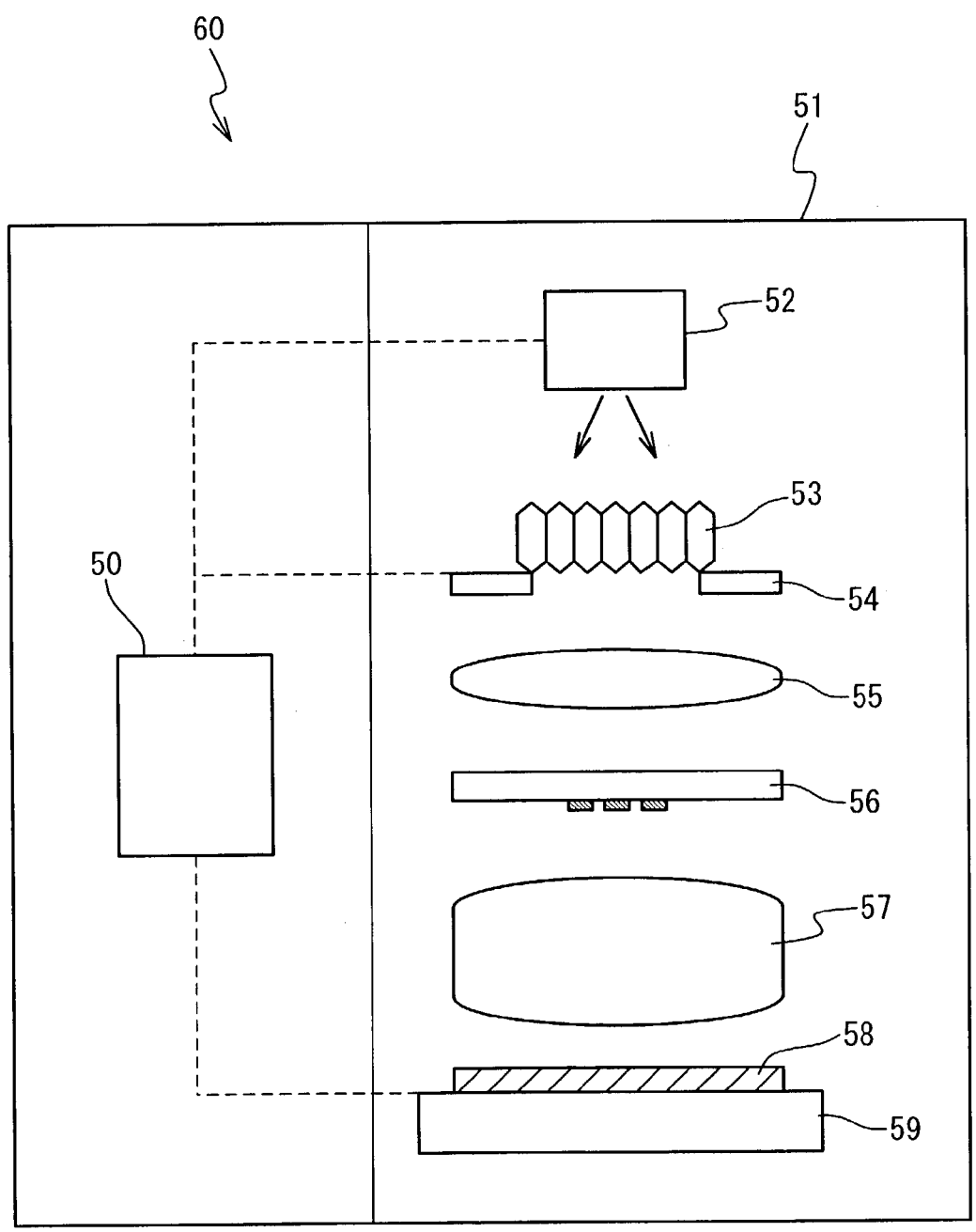
FIG. 10 is a view showing a configuration of an exposing apparatus.

FIG. 9 is a graph showing the example of the result when the wiring pattern is formed by using the Levenson's type phase shifting mask and then using the above-mentioned semiconductor device manufacturing method. That is, it is the graph showing the relation between a line width of a linear transfer pattern and a distance between lines adjacent to each other (an inter-line distance). Its horizontal axis is the inter-line distance (nm) between the linear transfer patterns, and its vertical axis is the line width (nm) of the linear transfer pattern. It shows in overlap with the graph of FIG. 4. The result of the conventional example is represented by a white circle (○: Re-Representation), and the result of the present invention is represented by a black circle (●). As can be seen from those results, even in the isolated pattern in the range in which the conventional compensation is impossible (the inter-line distance is 300 nm or more), the line width can be set to 100 nm in accordance with the design.

Thus, in the case of the range (the line width and the inter-line distance) in which the hyperfine structure can be attained in the dense pattern by using the Levenson's type phase shifting mask, the hyperfine structure can be similarly carried out even in the isolated pattern. That is, even if the circuit pattern in which the isolated pattern and the dense pattern are mixed, the hyperfine process can be similarly carried out without any necessity of the consideration of the proximity effect.

If the inter-line distance is longer than the line width of the linear transfer pattern, the assistant pattern can be formed. Thus, any hyperfine process can be attained. That is, there is no upper limit on the condition of the inter-line distance.

According to the present invention, in the exposure for transferring the circuit pattern in which the isolated pattern and the dense pattern are mixed, the hyperfine isolated pattern to the similar degree of the dense pattern can be easily formed without any influence on the cost and the throughput.

What is claimed is:

1. A photo mask which is used for exposure of an isolated pattern and a dense pattern for a semiconductor substrate, in which said dense pattern has a plurality of linear patterns, comprising:
   a transparent substrate;
   an isolated linear pattern defining the isolated pattern;
   a pair of first openings separated from each other by a first distance, wherein one of said pair of first openings is arranged at one side of said isolated linear pattern, and another of said pair of first openings is arranged at another side of said isolated linear pattern;
   a first assistant pattern provided apart from said isolated linear pattern by said one of said pair of first openings;
   a first assistant pattern opening arranged at one side of said first assistant pattern so that said first assistant pattern is disposed between said first assistant pattern opening and said one of said pair of first openings; and
   a plurality of second openings, wherein each of said plurality of linear patterns is sandwiched between two of said plurality of second openings that are adjacent to each other,
   wherein each of said plurality of linear patterns is separated from an adjacent linear pattern of said plurality of linear patterns by a predetermined distance,
   wherein a phase of light transmitted through said one first opening and a phase of light transmitted through said first assistant pattern opening are opposite to each other, and
   wherein a phase of light transmitted through one of said plurality of second openings and a phase of light transmitted through another of said plurality of second openings adjacent to said one of said second openings are opposite to each other.

2. The photo mask according to claim 1, further comprising:
   a second assistant pattern provided apart from said another first opening by said first distance; and
   a second assistant pattern opening arranged at one side of said second assistant pattern, so that said second assistant pattern is disposed between said second assistant pattern opening and said another first opening;
   wherein a phase of light transmitted through said another first opening and a phase of light transmitted through said second assistant pattern opening are opposite to each other.

3. The photo mask according to claim 1, wherein a pattern selected from said first assistant pattern opening, said one of said pair of first openings and said another of said pair of first openings, is covered with a shifter which shifts a phase of light transmitted through said pattern to an opposite phase comparing with a phase of light transmitted through a pattern adjacent to said pattern.

4. The photo mask according to claim 1, wherein a pattern selected from one of said first assistant pattern opening and said one of said pair of first openings is etched into a surface of said transparent substrate to form a surface relief in order to shift a phase of light transmitted through said pattern to an opposite phase comparing with a phase of light transmitted through a pattern adjacent to said pattern.

5. The photo mask according to claim 1, wherein said predetermined distance is equal to said first distance.

6. The photo mask according to claim 1, wherein said first assistant opening comprises the same shape as each one of said pair of first openings.

7. The photo mask according to claim 1, wherein each one of said pair of first openings comprises the same shape as each one of said plurality of second openings.

8. The photo mask according to claim 1, wherein said isolated pattern and said dense pattern are used for forming at least one of gate patterns and wiring patterns.

9. The photo mask according to claim 1, wherein a distance between said isolated linear pattern and one of said plurality of second openings which is the nearest of said plurality of openings to said isolated linear pattern is at least two times larger than a width of said isolated linear pattern.

10. A photo mask set which is used for exposure of an isolated pattern and a dense pattern for a semiconductor substrate, in which said dense pattern has a plurality of linear patterns, comprising:
    a first photo mask; and
    a second photo mask;
    wherein said first photo mask comprises:
      a transparent substrate;
      an isolated linear pattern defining the isolated pattern;
      a pair of first openings separated from each other by a first distance, wherein one of said pair of first openings is arranged at one side of said isolated linear pattern, and another of said pair of first openings is arranged at another side of said isolated linear pattern;
      a first assistant pattern provided apart from said isolated linear pattern by said one of said pair of first openings;
      a first assistant pattern opening arranged at one side of said first assistant pattern so that said first assistant pattern is disposed between said first assistant pattern opening and said one of said pair of first openings; and
      a plurality of second openings, wherein each of said plurality of linear patterns is sandwiched between two of said plurality of second openings that are adjacent to each other,
      wherein each of said plurality of linear patterns is separated from an adjacent linear pattern of said plurality of linear patterns by a predetermined distance,
      wherein a phase of light transmitted through said one first opening and a phase of light transmitted through said first assistant pattern opening are opposite to each other, and
      wherein a phase of light transmitted through one of said plurality of second openings and a phase of light transmitted through another of said plurality of second openings adjacent to said one of said second openings are opposite to each other,
    wherein said second photo mask comprises:
      a transparent substrate;
      a light shield isolated pattern covering said pair of first openings and said isolated linear pattern; and
      a plurality of light shield dense patterns covering said dense pattern.

11. The photo mask set according to claim 10, wherein said first photo mask further comprising:
    a second assistant pattern provided apart from said another first opening by said first distance; and a second assistant pattern opening arranged at one side of said second assistant pattern, so that said second assistant pattern is disposed between said second assistant pattern opening and said another first opening;

wherein a phase of light transmitted through said another first opening and a phase of light transmitted through said second assistant pattern opening are opposite to each other.

12. A photo mask which is used for exposure of a mixed pattern for a semiconductor substrate comprising:

a transparent substrate;

an isolated linear pattern disposed on a first position on said transparent substrate;

a plurality of dense linear patterns disposed on a second position on said transparent substrate, said first position being separated from said second position by a predetermined distance;

a first isolated linear pattern opening disposed on a first side of said isolated linear pattern;

a second isolated linear pattern opening disposed on a second side of said isolated linear pattern;

at least one assistant pattern disposed adjacent said first isolated linear pattern opening; and at least one assistant pattern opening disposed adjacent said at least one assistant pattern, wherein said at least one assistant pattern is positioned between said at least one assistant pattern opening and said first isolated linear pattern opening, and wherein a phase of a light transmitted through said at least one assistant opening and a phase of light transmitted through said first isolated linear pattern opening are opposite to each other.

13. A photomask set which is used for exposure of a mixed pattern for a semiconductor substrate comprising:

a first photo mask comprising:

a transparent substrate;

an isolated linear pattern disposed on a first position on said transparent substrate;

a plurality of dense linear patterns disposed on a second position on said transparent substrate, said first position being separated from said second position by a predetermined distance;

a first isolated linear pattern opening disposed on a first side of said isolated linear pattern;

a second isolated linear pattern opening disposed on a second side of said isolated linear pattern;

at least one assistant pattern disposed adjacent said first isolated linear pattern opening; and at least one assistant pattern opening disposed adjacent said at least one assistant pattern, wherein said at least one assistant pattern is positioned between said at least one assistant pattern opening and said first isolated linear pattern opening, and wherein a phase of a light transmitted through said at least one assistant opening and a phase of light transmitted through said first isolated linear pattern opening are opposite to each other; and a second photo mask comprising:

a transparent substrate; and a light shield isolated pattern covering said isolated linear pattern, said first isolated linear pattern opening and said second isolated linear pattern opening.

* * * * *